US009781775B2

(12) United States Patent
Jeanneteau et al.

(10) Patent No.: US 9,781,775 B2
(45) Date of Patent: Oct. 3, 2017

(54) HALF BRIDGE INDUCTION HEATING GENERATOR AND A CAPACITOR ASSEMBLY FOR A HALF BRIDGE INDUCTION HEATING GENERATOR

(71) Applicant: Electrolux Home Products Corporation N.V., Brussels (BE)

(72) Inventors: Laurent Jeanneteau, Forli (IT); Thibaut Rigolle, Forli (IT); Alex Viroli, Forli (IT); Andrea Fattorini, Forli (IT)

(73) Assignee: Electrolux Home Products Corporation NV, Brussels (BE)

( * ) Notice: Subject to any disclaimer, the term of this patent is extended or adjusted under 35 U.S.C. 154(b) by 108 days.

(21) Appl. No.: 14/396,482

(22) PCT Filed: May 21, 2013

(86) PCT No.: PCT/EP2013/060412
§ 371 (c)(1),
(2) Date: Oct. 23, 2014

(87) PCT Pub. No.: WO2013/178505
PCT Pub. Date: Dec. 5, 2013

(65) Prior Publication Data
US 2015/0144618 A1  May 28, 2015

(30) Foreign Application Priority Data

Jun. 1, 2012  (EP) .................................... 12170390

(51) Int. Cl.
*H05B 6/04* (2006.01)
*H01G 2/06* (2006.01)
(Continued)

(52) U.S. Cl.
CPC ............... *H05B 6/04* (2013.01); *H01G 2/065* (2013.01); *H01G 2/106* (2013.01); *H01G 4/38* (2013.01);
(Continued)

(58) Field of Classification Search
CPC combination set(s) only.
See application file for complete search history.

(56) References Cited

U.S. PATENT DOCUMENTS 3,706,980 A  12/1972  Maltby
4,025,864 A * 5/1977  Kennedy ................. H01F 29/14
                                                    219/660
(Continued)

FOREIGN PATENT DOCUMENTS

CN    100442501 C    12/2008
EP    1255421 A2     11/2002
JP    S63281380 A    11/1988

OTHER PUBLICATIONS

Office action (translation) issued in corresponding Chinese Patent Application No. 201380027645.8 dated Apr. 15, 2016, 9 pages.
(Continued)

*Primary Examiner* — Dana Ross
*Assistant Examiner* — Renee Larose
(74) *Attorney, Agent, or Firm* — Pearne & Gordon LLP

(57) ABSTRACT

The present invention relates to a half bridge induction heating generator, comprising at least one power terminal (10) provided for a direct current voltage, at least one ground terminal (12), and four capacitors (C2, C3, C4, C5) forming a bridge circuit between the power terminal (10) and the ground terminal (12). The induction heating generator comprises further an induction coil (L) interconnected in the center of said bridge circuit, two semiconductor switches (Q1, Q2) connected in each case parallel to one of the both
(Continued)

capacitors (C4, C5) on one side of the bridge circuit, and a further capacitor (CI) interconnected between the power terminal (10) and the ground terminal (12). The four capacitors (C2, C3, C4, C5) of the bridge circuit and the further capacitor (C1) are arranged inside a common housing (20), wherein said housing (20) and the capacitors (C1, C2, C3, C4, C5) form a capacitor assembly, which is a single component and mounted or mountable on and electrically connected or connectable to a printed circuit board. Further, the present invention relates to a capacitor assembly provided for said half bridge induction heating generator.

12 Claims, 2 Drawing Sheets

(51) Int. Cl.
| | |
|---|---|
| *H02M 7/00* | (2006.01) |
| *H05B 6/06* | (2006.01) |
| *H01G 4/38* | (2006.01) |
| *H01G 4/40* | (2006.01) |
| *H01G 2/10* | (2006.01) |
| *H05K 1/05* | (2006.01) |
| *H05K 1/11* | (2006.01) |
| *H02M 7/48* | (2007.01) |

(52) U.S. Cl.
CPC ............... *H01G 4/385* (2013.01); *H01G 4/40* (2013.01); *H02M 7/003* (2013.01); *H05B 6/06* (2013.01); *H05K 1/05* (2013.01); *H05K 1/115* (2013.01); *H02M 2007/4815* (2013.01); *Y02B 70/1441* (2013.01)

(56) References Cited

U.S. PATENT DOCUMENTS

| | | | |
|---|---|---|---|
| 6,064,584 A | 5/2000 | Cornec | |
| 6,229,124 B1* | 5/2001 | Trucco | B23K 1/002 |
| | | | 219/605 |
| 6,346,743 B1* | 2/2002 | Figueroa | H01L 23/642 |
| | | | 257/678 |
| 2004/0149735 A1* | 8/2004 | Ogasawara | G03G 15/2053 |
| | | | 219/619 |
| 2006/0092595 A1 | 5/2006 | Hwa et al. | |
| 2010/0014333 A1* | 1/2010 | Shimada | H05B 6/04 |
| | | | 363/126 |
| 2010/0148582 A1* | 6/2010 | Carter | B60L 11/1861 |
| | | | 307/48 |

OTHER PUBLICATIONS

International Search Report for PCT/EP2013/060412, dated Aug. 29, 2014, 2 pages.

\* cited by examiner

HALF BRIDGE INDUCTION HEATING GENERATOR AND A CAPACITOR ASSEMBLY FOR A HALF BRIDGE INDUCTION HEATING GENERATOR

The present invention relates to a half bridge induction heating generator according to the preamble of claim 1. Further, the present invention relates to a capacitor assembly according to the preamble of claim 11.

Figure 2:
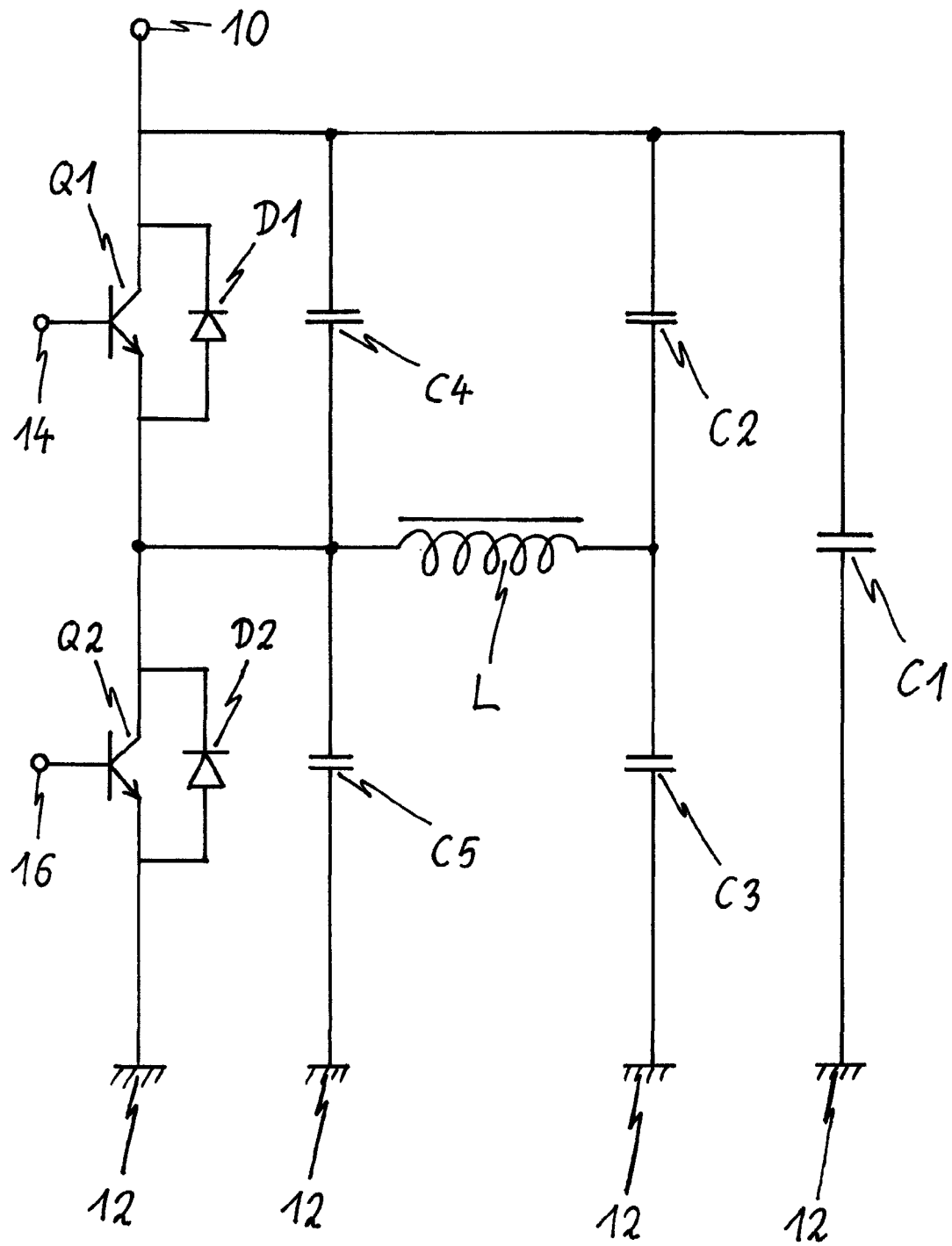

A half bridge induction heating generator is used in an induction heating converter. FIG. 2 illustrates a half bridge induction heating generator according to the prior art. Said half bridge induction heating generator comprises two transistors Q1 and Q2, two diodes D1 and D2, an induction coil L and five capacitors C1, C2, C3, C4 and C5. The first capacitors C1 acts as a link filter for the direct current. The second and third capacitors C2 and C3 are resonant capacitors. The resonant capacitors C2 and C3 match the resonant frequency of the induction heating generator. The fourth and fifth capacitors C4 and C5 are snubber capacitors managing the switching behaviour of the transistors Q1 and Q2, respectively.

The induction heating generator includes a relative large amount of capacitors C1, C2, C3, C4 and C5. Further, the capacitances of the capacitors C1, C2, C3, C4 and C5 are also relative high. The capacitors C1, C2, C3, C4 and C5 have to be placed on a printed circuit board of the converter in a careful way. The stray inductance has to be minimized. The power track should be able to carry on the large amount of switching current. A space on the printed circuit board should be provided for other components of the induction heating generator. High power terminals should be provided for the supply voltage and the induction coil L.

It is an object of the present invention to provide a half bridge induction heating generator, which satisfies the above conditions by low complexity.

The object of the present invention is achieved by the half bridge induction heating generator according to claim 1.

According to the present invention the four capacitors of the bridge circuit and the further capacitor are arranged inside a common housing, wherein said housing and the capacitors form a capacitor assembly, which is a single component and mounted or mountable on and electrically connected or connectable to a printed circuit board.

The main idea of the present invention is that the capacitors are arranged inside the common housing and form the capacitor assembly. The capacitor assembly with the housing and the capacitors reduces the components to be installed on the printed circuit board. This result in a faster production process and lower production costs. Additional components may be arranged inside the capacitor assembly. The capacitor assembly allows a better performance of the power management of the induction heating generator. The capacitor assembly saves space on the printed circuit board.

In particular, the housing is filled with a hardening liquid, so that the capacitor assembly form a robust block. This contributes to the stability of the housing and the capacitor assembly. Further, no heat sinks occur inside the capacitor assembly.

Preferably, the power terminal is arranged at the outside of the housing of the capacitor assembly, wherein the power terminal is connected or connectable to a corresponding wiring counterpart. This is particularly advantageous, if the housing is mounted on an insulated metal substrate (IMS) printed circuit board by the surface mount device (SMD) technology.

Further, the housing comprises a plurality of terminals corresponding with the electrodes of the capacitors, wherein the electric connections of the capacitors are performed or performable on the printed circuit board.

For example, the space between the housing and the printed circuit board is provided for further electric and/or electronic components. This constellation saves space on the printed circuit board.

Additionally, further electric and/or electronic components are arranged inside the housing.

Further, at least one diode is connected in parallel to each of the both semiconductor switches. Thus, the induction heating generator includes at least two diodes at all, wherein one diode is connected in parallel to one of the both semiconductor switches in each case.

For example, the housing is mounted or mountable on and electrically connected or connectable to the printed circuit board with through-hole-technology.

Alternatively, the housing is mounted or mountable on and electrically connected or connectable to an insulated metal substrate (IMS) printed circuit board by the surface mount device (SMD) technology. In this case, the power terminal is preferably arranged at the housing of the capacitor assembly.

Preferably, a first input terminal is connected to a control input of the one semiconductor switch, and a second input terminal is connected to a control input of the other semiconductor switch.

For example, the semiconductor switches are bipolar transistors. In this case, the first input terminal and the second input terminal may be connected to the base electrodes of the bipolar transistors in each case.

Alternatively, the semiconductor switches are field effect transistors, wherein the first input terminal and the second input terminal may be connected to the gate electrodes of the field effect transistors in each case.

The object of the present invention is further achieved by the capacitor assembly according to claim 11.

According to the present invention the four capacitors of the bridge circuit and the further capacitor are arranged inside a common housing, wherein said housing and the capacitors form a capacitor assembly, which is a single component and mountable on and electrically connectable to a printed circuit board.

Preferably, the housing is filled with a hardening liquid, so that the capacitor assembly form a robust block. This contributes to the stability of the housing and the capacitor assembly. Further, no heat sinks occur inside the capacitor assembly.

For example, the housing is mountable on and electrically connectable to a printed circuit board with through-hole-technology.

Alternatively, the housing is mountable on and electrically connectable to an insulated metal substrate (IMS) printed circuit board by the surface mount device (SMD) technology.

In this case, the power terminal is preferably arranged at the housing of the capacitor assembly.

At last, a power terminal may be arranged at the housing of the capacitor assembly, wherein the power terminal is provided for the connection to a corresponding wiring counterpart.

Novel and inventive features of the present invention are set forth in the appended claims.

Figure 1:
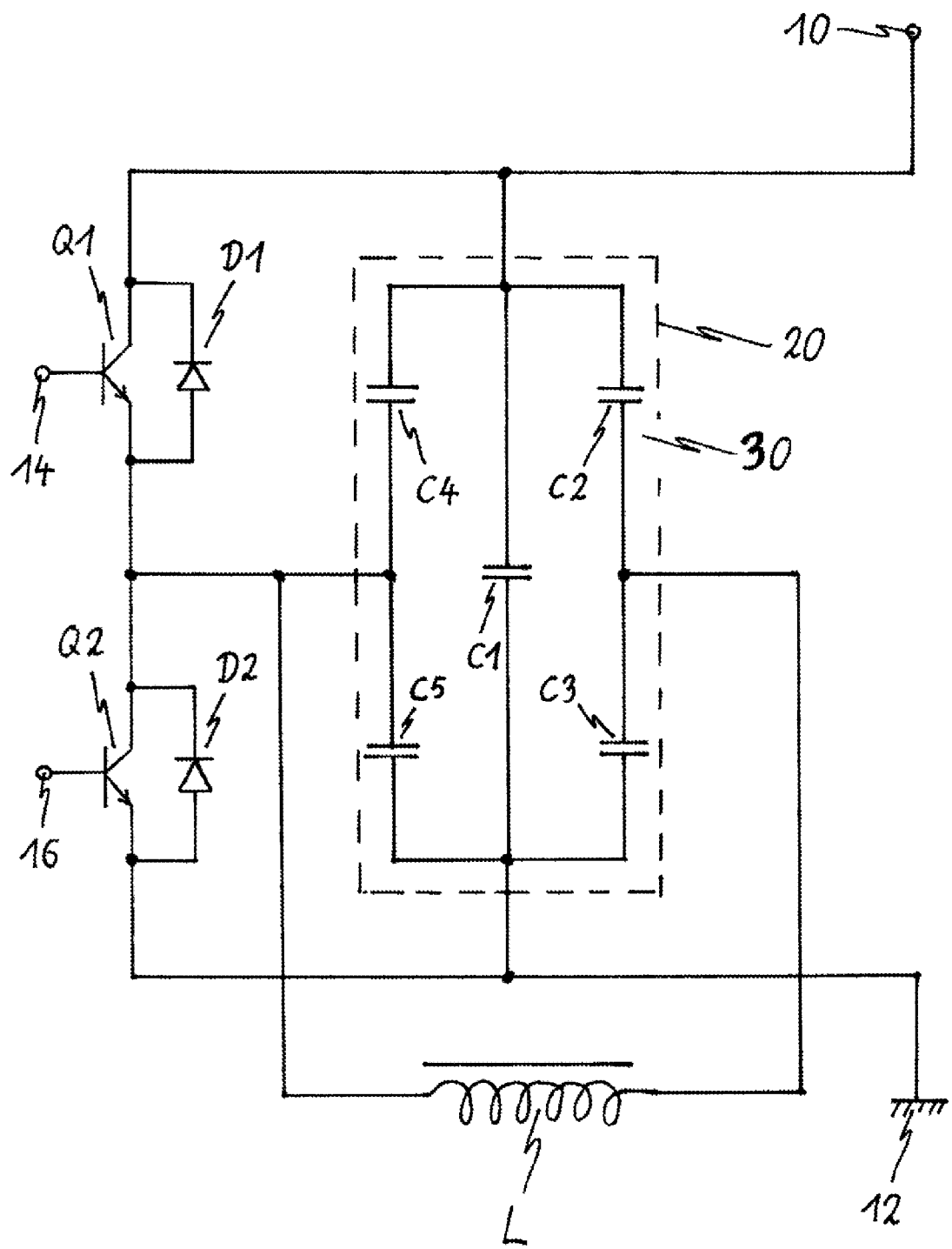

The present invention will be described in further detail with reference to the drawings, in which FIG. 1 illustrates a circuit diagram of a half bridge induction heating generator according to a preferred embodiment of the present invention, and FIG. 2 illustrates a circuit diagram of a half bridge induction heating generator according to the prior art.

FIG. 1 illustrates a circuit diagram of a half bridge induction heating generator according to a preferred embodiment of the present invention.

The half bridge induction heating generator comprises a first transistor Q1, a second transistor Q2, a first diode D1, a second diode D2, an induction coil L and five capacitors C1, C2, C3, C4 and C5.

The first transistor Q1 and the second transistor Q2 are connected in series. The first diode D1 is connected in parallel to the first transistor Q1. In a similar way, the second diode D2 is connected in parallel to the second transistor Q2.

The second capacitor C2 and the third capacitor C3 are connected in series A space (30) between the housing (20) and the printed circuit board is provided for further electric and/or electronic components. This constellation saves space on the printed circuit board. and form a first capacitor series. The fourth capacitor C4 and the fifth capacitor C5 are connected in series and form a second capacitor series. The first capacitor series, the second capacitor series and the first capacitor C1 are connected in parallel and installed inside a common housing 20. Said housing 20 is formed as a single component installed or installable on the printed board. The housing 20 and the capacitors C1, C2, C3, C4 and C5 inside said housing 20 form a capacitor assembly.

Further, the series of the first transistor Q1 and the second transistor Q2 is connected in parallel to the first capacitor series, the second capacitor series and the first capacitor C1. This parallel arrangement is interconnected between a power terminal 10 and a ground 12. The power terminal 10 is provided for the supply of a direct current voltage.

Moreover, the connecting point of the first transistor Q1 and the second transistor Q2 is connected to the connecting point of the fourth capacitor C4 and the fifth capacitor C5. Thus, the fourth capacitor C4 is connected in parallel to the first transistor Q1 and the first diode D1. In a similar way, the fifth capacitor C5 is connected in parallel to the second transistor Q2 and the second diode D2.

The induction coil L is connected to the connecting point of the first transistor Q1 and the second transistor Q2 on the one end. On the other end, the induction coil L is connected to the connecting point of the second capacitor C2 and the third capacitor C3.

A first input terminal 14 is connected to the base electrode of the first transistor Q1. In a similar way, a second input terminal 16 is connected to the base electrode of the second transistor Q2. The first input terminal 14 and the second input terminal 16 are provided for the supply of rectangular signals.

The first capacitor C1 acts as a link filter for the direct current supplied to the power terminal 10. The second capacitor C2 and the third capacitor C3 are resonant capacitors. The resonant capacitors C2 and C3 match the resonant frequency of the induction heating generator. The fourth capacitor C4 and the fifth capacitor C5 are snubber capacitors managing the switching behaviour of the transistors Q1 and Q2, respectively.

The capacitor assembly, i.e. the housing 20 including the capacitors C1, C2, C3, C4 and C5, may be provided for a printed circuit board with through-hole-technology as well as for an insulated metal substrate (IMS) printed circuit board. For example, the power terminal 10 may be formed according to the standard "RAST5" in both cases. The power terminal 10 is provided for the connection to a corresponding wiring counterpart.

If the capacitor assembly is provided for the printed circuit board with through-hole-technology, then the capacitor assembly comprises a number of pins penetrating through the printed circuit board. Said pins are connectable or connected by solder points on the printed circuit board.

If the capacitor assembly is provided for the IMS printed circuit board, then the capacitor assembly is fastened on the IMS printed circuit board by the surface mount device (SMD) technology. In this case, the capacitor assembly comprises a number of solder joints formed as L-shaped pins. Said solder joints are fastened on the IMS printed circuit board by the SMD technology in each case.

If the capacitor assembly is provided for the IMS printed circuit board, then the power terminal 10 is preferably a part of the capacitor assembly. When the wiring counterpart of the power terminal 10 is plugged to or unplugged from the power terminal 10, then the occurrent force between the power terminal 10 and the IMS printed circuit board is distributed to the solder joints. Thus, the capacitor assembly allows an attachment of the power terminal 10 with a sufficient stability on the IMS printed circuit board.

The capacitor assembly with the housing 20 and the capacitors C1, C2, C3, C4 and C5 reduces the components to be installed on the printed circuit board. This result in a faster production process and lower production costs. Additional components may be arranged inside the capacitor assembly. The capacitor assembly allows a better performance of the power management of the induction heating generator. At last, the capacitor assembly saves space on the printed circuit board.

FIG. 2 illustrates a circuit diagram of the half bridge induction heating generator according to the prior art.

The conventional half bridge induction heating generator comprises the two transistors Q1 and Q2, the two diodes D1 and D2, the induction coil L and the five capacitors C1, C2, C3, C4 and C5. The first capacitor C1 acts as the link filter for the direct current. The second and third capacitors C2 and C3 are the resonant capacitors. The resonant capacitors C2 and C3 match the resonant frequency of the induction heating generator. The fourth and fifth capacitors C4 and C5 are snubber capacitors managing the switching behaviour of the transistors Q1 and Q2, respectively.

This conventional half bridge induction heating generator is equal in view of the electric connections with the half bridge induction heating generator according to the preferred embodiment of the present invention. However, the capacitors C1, C2, C3, C4 and C5 of the conventional half bridge induction heating generator are formed as separate components in each case.

Although an illustrative embodiment of the present invention has been described herein, it is to be understood that the present invention is not limited to that precise embodiment, and that various other changes and modifications may be affected therein by one skilled in the art without departing from the scope or spirit of the invention. All such changes and modifications are intended to be included within the scope of the invention as defined by the appended claims.

LIST OF REFERENCE NUMERALS 10 power terminal
12 ground terminal
14 first input terminal
16 second input terminal
20 housing 30 space
Q1 first transistor
Q2 second transistor
D1 first diode
D2 second diode
C1 first capacitor
C2 second capacitor
C3 third capacitor
C4 fourth capacitor
C5 fifth capacitor
L induction coil

The invention claimed is:

1. A half bridge induction heating generator, comprising:
at least one power terminal (10) provided for a direct current voltage,
at least one ground terminal (12),
four capacitors (C2, C3, C4, C5) forming a bridge circuit between the power terminal (10) and the ground terminal (12),
an induction coil (L) interconnected in the centre of said bridge circuit,
two semiconductor switches (Q1, Q2) connected in each case parallel to one of capacitors (C4, C5) on one side of the bridge circuit, and
a further capacitor (C1) interconnected between the power terminal (10) and the ground terminal (12), characterized in that
the four capacitors (C2, C3, C4, C5) of the bridge circuit and the further capacitor (C1) are arranged inside a common housing (20), wherein said housing (20) and the capacitors (C1, C2, C3, C4, C5) form a capacitor assembly, which is a single component and mounted or mountable on and electrically connected or connectable to a printed circuit board,
wherein a first end of the induction coil (L) is connected to a connection point of the two semiconductor switches (Q1, Q2) and a second end of the induction coil (L) is connected to a connecting point of two of the four capacitors (C2, C3, C4, C5).

2. The induction heating generator according to claim 1, characterized in that the housing (20) is filled with a hardening liquid, so that the capacitor assembly form a robust block.

3. The induction heating generator according to claim 1, characterized in that the power terminal (10) is arranged at the outside of the housing (20) of the capacitor assembly, wherein the power terminal (10) is connected or connectable to a corresponding wiring counterpart.

4. The induction heating generator according to claim 1, characterized in that the housing (20) comprises a plurality of terminals corresponding with the electrodes of the capacitors (C1, C2, C3, C4, C5), wherein the electric connections of the capacitors (C1, C2, C3, C4, C5) are performed or performable on the printed circuit board.

5. The induction heating generator according to claim 1, characterized in that a space between the housing (20) and the printed circuit board is provided for further electric and/or electronic components.

6. The induction heating generator according to claim 1, characterized in that further electric and/or electronic components are arranged inside the housing (20).

7. The induction heating generator according to claim 1, characterized in that at least one diode (D1, D2) is connected in parallel to each of the two semiconductor switches (Q1, Q2).

8. The induction heating generator according to claim 1, characterized in that the housing (20) is mounted or mountable on and electrically connected or connectable to the printed circuit board with through-hole-technology.

9. The induction heating generator according to claim 1, characterized in that the housing (20) is mounted or mountable on and electrically connected or connectable to an insulated metal substrate (IMS) printed circuit board by the surface mount device (SMD) technology.

10. The induction heating generator according to claim 1, characterized in that a first input terminal (14) is connected to a control electrode of the one semiconductor switch (Q1), and a second input terminal (16) is connected to a control electrode of the other semiconductor switch (Q2), wherein said semiconductor switches (Q1, Q2) are bipolar transistors and the first input terminal (14) and the second input terminal (16) are connected to the base electrodes of the semiconductor switches (Q1, Q2).

11. A half bridge induction heating generator, comprising:
at least one power terminal (10) provided for a direct current voltage,
at least one ground terminal (12),
four capacitors (C2, C3, C4, C5) forming a bridge circuit between the power terminal (10) and the ground terminal (12),
an induction coil (L) interconnected in the centre of said bridge circuit,
two semiconductor switches (Q1, Q2) connected in each case parallel to one of capacitors (C4, C5) on one side of the bridge circuit, and
a further capacitor (C1) interconnected between the power terminal (10) and the ground terminal (12), characterized in that
the four capacitors (C2, C3, C4, C5) of the bridge circuit and the further capacitor (C1) are arranged inside a common housing (20), wherein said housing (20) and the capacitors (C1, C2, C3, C4, C5) form a capacitor assembly, which is a single component and mounted or mountable on and electrically connected or connectable to a printed circuit board, and characterized in that a first input terminal (14) is connected to a control electrode of the one semiconductor switch (Q1), and a second input terminal (16) is connected to a control electrode of the other semiconductor switch (Q2), wherein the semiconductor switches (Q1, Q2) are field effect transistors and the first input terminal (14) and the second input terminal (16) are connected to the gate electrodes of the semiconductor switches (Q1, Q2).

12. The induction heating generator according to claim 1, wherein capacitances of the four capacitors (C2, C3, C4, C5) are high.

* * * * *

UNITED STATES PATENT AND TRADEMARK OFFICE
CERTIFICATE OF CORRECTION

PATENT NO.       : 9,781,775 B2
APPLICATION NO.  : 14/396482
DATED            : October 3, 2017
INVENTOR(S)      : Laurent Jeanneteau et al.

It is certified that error appears in the above-identified patent and that said Letters Patent is hereby corrected as shown below:

In the Specification

Please amend the paragraph beginning at Column 3, Line 17 as follows:
The second capacitor C2 and the third capacitor C3 are connected in series and form a first capacitor series. The fourth capacitor C4 and the fifth capacitor C5 are connected in series and form a second capacitor series. The first capacitor series, the second capacitor series and the first capacitor C1 are connected in parallel and installed inside a common housing 20. Said housing 20 is formed as a single component installed or installable on the printed board. The housing 20 and the capacitors C1, C2, C3, C4 and C5 inside said housing 20 form a capacitor assembly.
A space (30) between the housing (20) and the printed circuit board is provided for further electric and/or electronic components. This constellation saves space on the printed circuit board.

Signed and Sealed this
Twenty-sixth Day of December, 2017

Joseph Matal
*Performing the Functions and Duties of the
Under Secretary of Commerce for Intellectual Property and
Director of the United States Patent and Trademark Office*